United States Patent [19]

Freer

[11] Patent Number: 5,430,412
[45] Date of Patent: Jul. 4, 1995

[54] AMPLIFIER WITH LOSSLESS FEEDBACK

[75] Inventor: David A. Freer, Forest, Va.

[73] Assignee: Grayson Electronics Company, Forest, Va.

[21] Appl. No.: 970,179

[22] Filed: Nov. 2, 1992

[51] Int. Cl.⁶ .............................................. H03F 1/34
[52] U.S. Cl. ..................................... 330/286; 330/53; 330/107; 330/294
[58] Field of Search ............... 330/107, 109, 286, 294, 330/53, 54

[56] References Cited

U.S. PATENT DOCUMENTS

| | | | |
|---|---|---|---|
| 3,277,373 | 10/1966 | Allen | 330/109 UX |
| 3,426,298 | 2/1969 | Sontheimer et al. | 333/10 |
| 3,618,126 | 11/1971 | Gerst et al. | 330/294 X |
| 3,624,536 | 11/1971 | Norton | 330/53 |
| 3,731,217 | 5/1973 | Gerst et al. | 330/56 |
| 3,891,934 | 6/1975 | Norton et al. | 330/21 |
| 4,042,887 | 8/1977 | Mead et al. | 330/286 X |

OTHER PUBLICATIONS

Shimizu et al, "Coupled-Transmission-Line-Directional Couplers", *Ire Transactions on Microwave Theory and Techniques*, Oct., 1958 pp. 403–410.

D. Norton, "High Dynamic Range Transistor Amplifiers Using Lossless Feedback", *Microwave Journal*, May 1976, pp. 53–57.

Ezzeddine et al., "An MMAC C-Band FET Feedback Power Amplifier", *IEEE Transactions on Microwave Technology and Techniques*, vol. 38, No. 4, Apr. 1990, pp. 350–357.

"Amplifier Application Notes" *Microwave Journal*, Oct. 1982, pp. 130–136.

*Primary Examiner*—James B. Mullins
*Attorney, Agent, or Firm*—Dressler, Goldsmith, Shore & Milnamow, Ltd.

[57] ABSTRACT

An amplifier, suitable for use in a limited band at microwave frequencies, incorporates a single lossless feedback coupling element between the input port and output port of the gain circuitry. The feedback element is formed of two coextending conductors of a length on the order of a quarter wavelength of the center frequency of the band. An input signal is coupled to the gain element through one of the feedback conductors. An output signal is coupled from the output port of the gain element through the other of the conductors of the feedback element. Relatively low closed loop gain, on the order of 10 dB, is achievable over the specified band at center frequencies on the order of 800–1000 MHz.

17 Claims, 4 Drawing Sheets ns. 5,430,412

AMPLIFIER WITH LOSSLESS FEEDBACK

FIELD OF THE INVENTION

The invention pertains to high frequency amplifiers. More particularly, the invention pertains to amplifiers usable at microwave frequencies where a relatively low closed loop gain, on the order of 10 dB, is desirable.

BACKGROUND OF THE INVENTION

Feedback amplifiers have long been used in a variety of electronic circuits. By means of a feedback element, circuit stability and linearity can be improved. To accomplish this end, it is well known to use negative feedback in combination with resistive feedback elements.

It has also been recognized that lossless feedback elements, such as transformers, can be used to improved amplifier performance without the attendant losses associated with resistive elements. Representative examples of such circuits can be found in Sontheimeyer et al., U.S. Pat. No. 3,426,298; Norton, U.S. Pat. No., 3,624,536; or Norton et al., U.S. Pat. No. 3,891,934.

Another example of such an amplifier can be found in Ezzeddine et al., published April 1990 in the IEEE Transactions on Microwave Theory and Techniques, entitled "NMMAC C-Band FET Feedback Power Amplifier". The amplifier of this article is intended to be used in a frequency range on the order of 3-5 gigahertz, in connection with satellite communication.

It is also been known to combine an input coupling element with an output coupling element and a gain element to provide a low loss feedback mechanism. FIG. 1 illustrates a suggested prior lossless feedback approach which confines an input coupling element C1, an output coupling element C2, and a gain element G.

The system of FIG. 1 could be expected to have a loss of 10 dB associated with each coupler. As a result, close loop gains less than 20 dB are particularly difficult to achieve.

Thus, there continues to be a need for amplifiers operable at microwave frequencies, which can provide relatively low closed loop gains on the order of 10 dB or so. Such amplifiers, if achievable, will provide improved linearity and enhanced intermodulation performance.

SUMMARY OF THE INVENTION

In accordance with the invention, an amplifier is provided which is usable in a predetermined frequency range, with a center frequency on the order of 700–1000 MHz. The present amplifier has a relatively low closed loop gain with enhanced intermodulation performance.

The amplifier includes an input node and an amplified signal output node. A gain element is provided with an input port and an output port. The gain element is chosen so that it has substantially no delay between the ports in the frequency range of interest.

A single, lossless, transformerless, feedback coupling element is used to provide negative feedback, such that a relatively low closed loop gain can be achieved with the amplifier. The feedback element includes first and second elongated conducting members, which are positioned adjacent to one another.

The conducting members can be deposited onto either a ceramic or a glass-epoxy substrate. One of the coupling conductors is coupled in series between the input node and the input port of the amplifier. The other is coupled in series between the output port of the gain element and the output terminal.

Coupling is provided between the two extending adjacent conductive elements such that negative feedback is applied between the output port of the gain element and the input port. Representative lengths of the conductive coupling elements are on the order of a quarter wavelength of the center frequency of the amplifier.

In a preferred embodiment, the coupling element represents on the order of 10 dB of loss. Hence, an amplifier with a closed loop gain on the order of 10 dB or less can be achieved.

It will understood that the coextending coupling conductors can be linear. Alternately, they can be curved.

A band limiting filter can be provided in combination with a phase offset adjustment element. The filter controls the gain and phase margins over the frequency range of interest. The phase offset adjustment element makes it possible to achieve negative feedback with the input signals and output signals 180° out of phase in the frequency range of interest, thereby providing stable performance.

In a preferred embodiment, the input impedance and the output impedance of the gain element will be substantially equal to the impedance of the coupler at the designated center frequency. Further, the gain element has substantially no delay through it at the frequency range of interest in order to minimize the possibility of creating instability due to phase delays.

In summary, a very low closed loop gain, on the order of 10 dB, feedback amplifier usable at band limited microwave frequencies incorporates a gain element in combination with a lossless feedback element. The feedback element is formed of two co-extensive coupled conductors. One conductor is in the input side of the amplifier. The other is in the output side. A phase adjusting element and a band limiting filter are incorporated into the amplifier and provide a stable negative feedback condition in a predetermined band.

These and other aspects and attributes of the present invention will be discussed with reference to the following drawings and accompanying specification.

DETAILED DESCRIPTION OF THE PREFERRED EMBODIMENT

Figure 1:
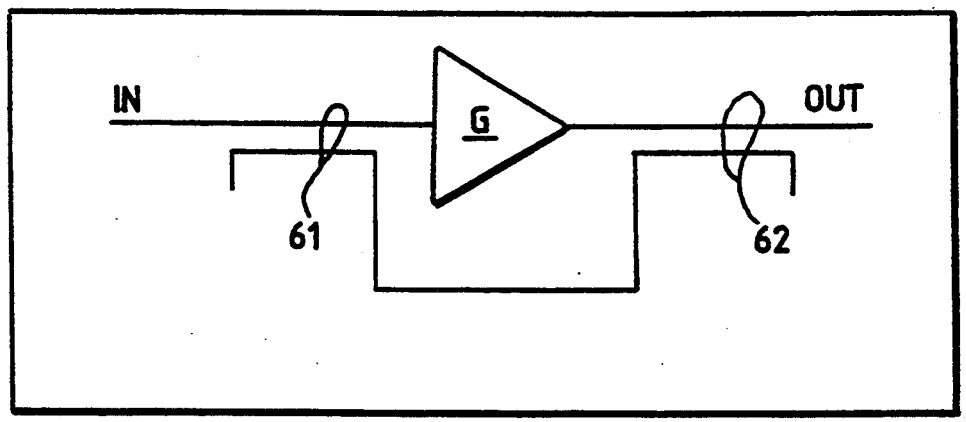
FIG. 1 is a schematic diagram of a prior art amplifier system having lossless feedback.

While this invention is susceptible of embodiment in many different forms, there is shown in the drawing, and will be described herein in detail, specific embodiments thereof with the understanding that the present disclosure is to be considered as an exemplification of the principles of the invention and is not intended to limit the invention to the specific embodiments illustrated.

Figure 2:
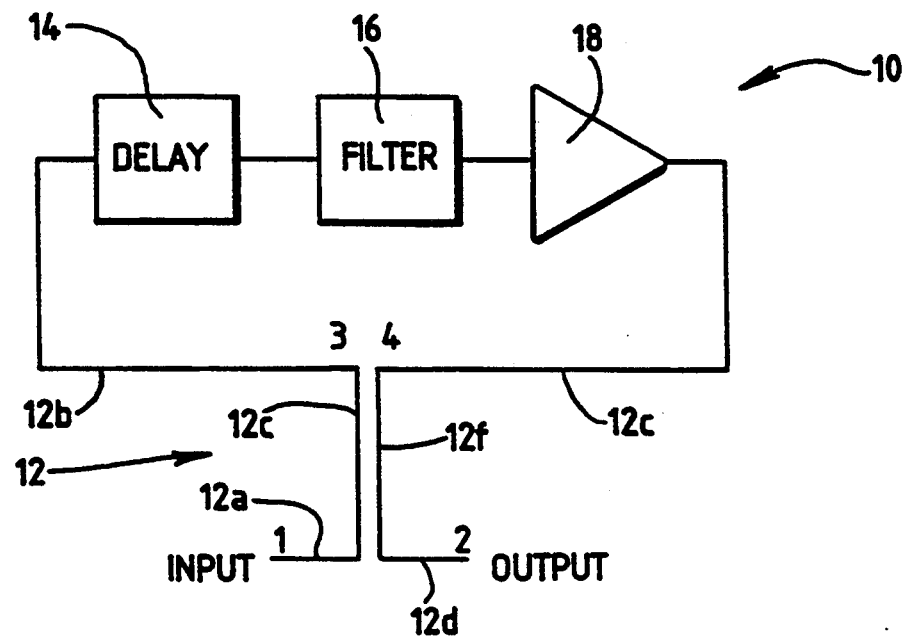
FIG. 2 is a block diagram schematic of a closed loop amplifier in accordance with the present invention.

In accordance with the present invention, FIG. 2 illustrates a block diagram schematic of a closed loop amplifier system 10. The amplifier system 10 includes a four port coupler element 12, a delay or phase adjusting element 14, a band limiting filter 16, and a gain element 18.

The coupling element 12 has four ports 12a–12d. Port 12a is an input port to which an electrical signal to be amplified can be coupled. Port 12d is an output port from which an amplified output electrical signal can be received.

The coupler 12 is formed of two adjacent conducting, microstrip lines 12e, 12f. The lines 12e, 12f are a quarter wavelength long at a center frequency of the amplifier. The lines 12e, 12f have a coupling factor on the order of 11.5 dB.

The delay line or phase adjusting element 14 is formed of a 50 Ohm coaxial section having an electrical length on the order of one-half wavelength of the center frequency or less. The length of the delay line is dependent on the shift necessary to establish a 180° loop phase response at a center frequency of the amplifier.

The filter 16 is a band limiting filter which, in an exemplary embodiment, is centered at 866 MHz, with a 20 MHz band width. The filter 16 preferably will be implemented as a single pole dielectric resonator filter.

It will be understood that the details of the implementation of the phase adjusting element, delay line 14, and the band limiting filter 16 are not a limitation of the present invention.

Figure 3:
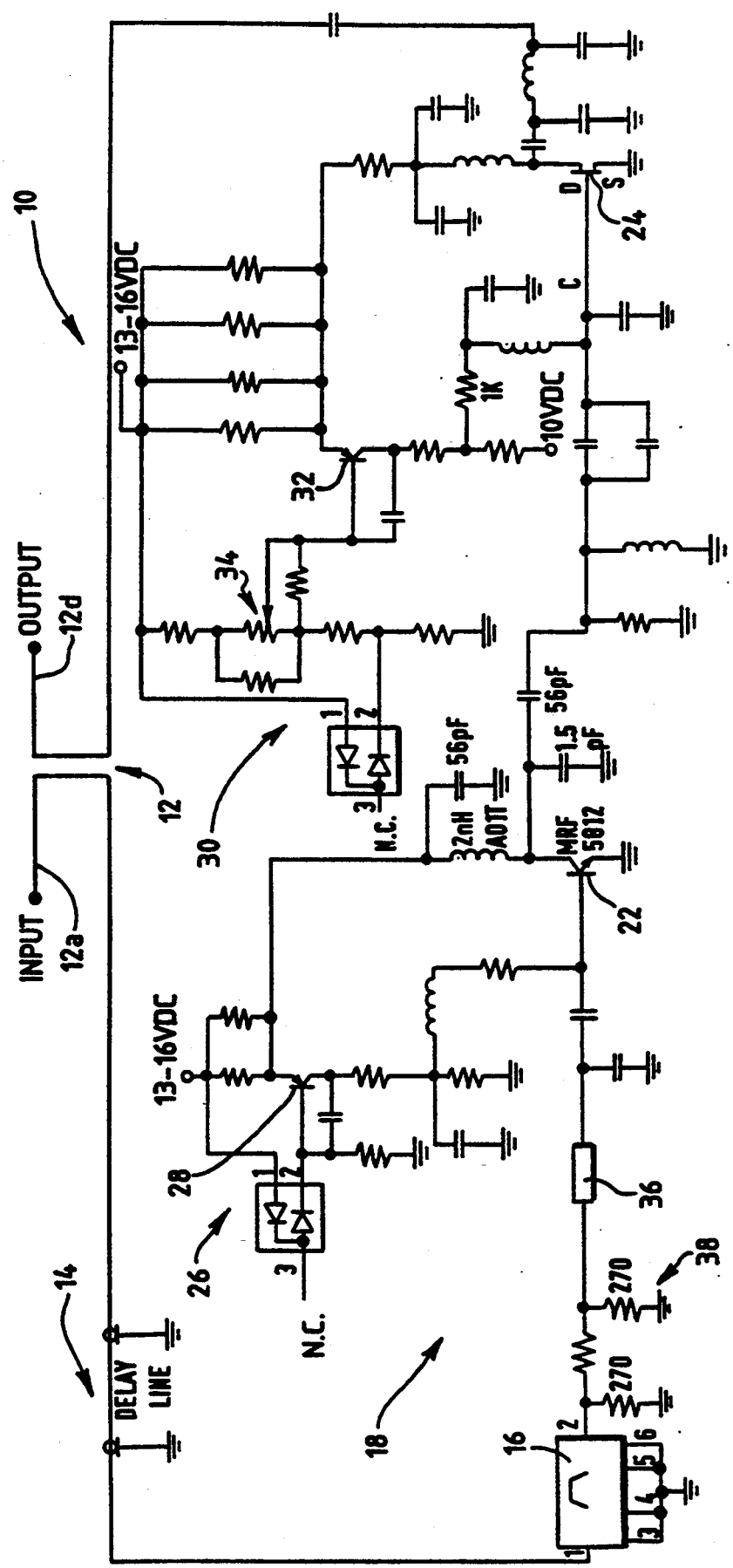
FIG. 3 is a more detailed schematic of the amplifier of FIG. 2.

FIG. 3 is a detailed schematic diagram of the amplifier of FIG. 2. The amplifier 10 is implemented with an input stage 22, which could be a Motorola MRF5812 bipolar transistor. Coupled to the input stage transistor 22 is a medium power-high gain GaasFet transistor 24, such as an Avantek ATF 45101.

The transistors 22, 24 provide about 30 dB of gain and a third order intercept of 44 dBm at 866 MHz. Each transistor has its own active bias source.

The input transistor 22 is biased by a source 26, which includes a pnp transistor 28. The output transistor 24 is biased by a source 30 which includes a pnp transistor 32. The transistors 22, 24 are biased for class A operation.

The sources 26, 30 provide bias point stabilization to offset device parameter and temperature variations. The linear performance of the output transistor 24 can be optimized by adjusting its bias point via a potentiometer 34. An inductor or section of printed wiring 36 is used to match the impedance of the transistor 22 to input resistors 38.

Figure 4:
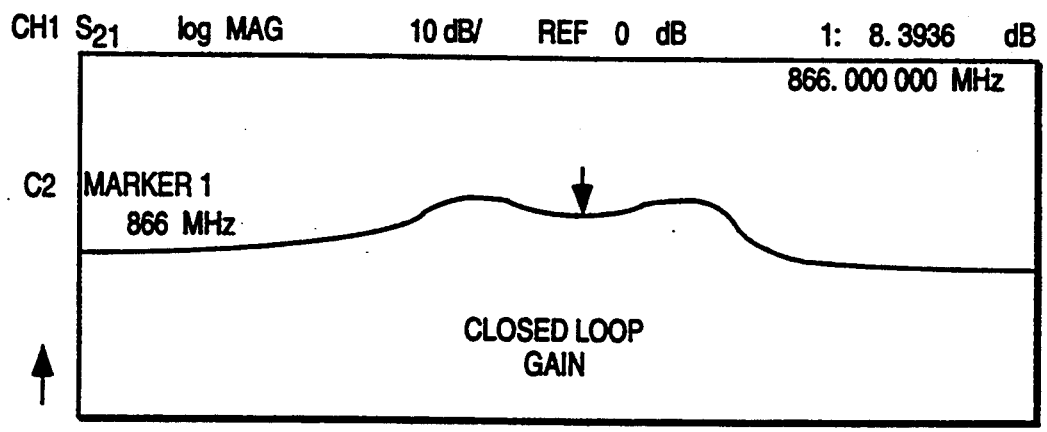
FIG. 4 is a graph illustrating closed loop gain of the amplifier of FIG. 3.

FIG. 4 is a graph of the closed loop gain of the amplifier 10 as a function of frequency with a center frequency of 866 MHz. As is illustrated in FIG. 4, a closed loop gain on the order of 10 dB over a 20 MHz bandwidth can be achieved utilizing the amplifier 10.

Figure 5:
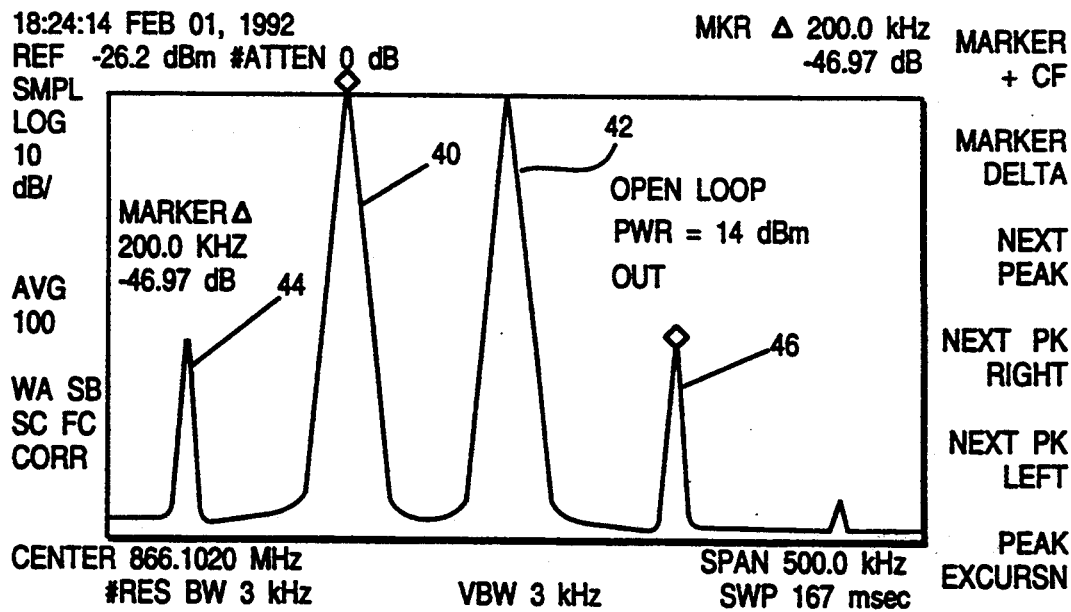
FIG. 5 is a graph illustrating open loop intermodulation characteristics of the amplifier of FIG. 3 as a function of frequency with a power output of 14 dBm.

FIG. 5 is a graph illustrating open loop intermodulation characteristics of the amplifier 10 as a function of frequency with 14 dBm output power. An 866 MHz signal and a 866.1 MHz signal were applied to the input 12a of the amplifier 10. Output signals 40, 42 at 866 MHz and 66.1 MHz, as well as unwanted output sideband signals 44, 46 at 865.9 MHz and 866.2 MHz, are illustrated in FIG. 5. FIG. 5 thus displays the open loop intermodulation characteristics of the amplifier 10.

Figure 6:
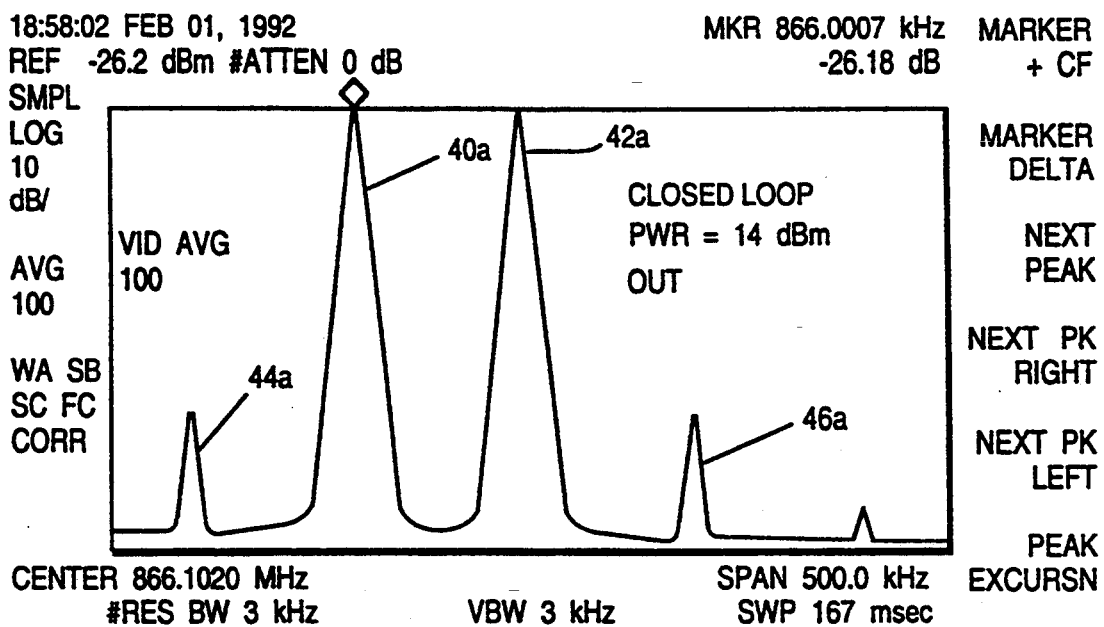
FIG. 6 is a graph illustrating closed loop intermodulation characteristics of the amplifier of FIG. 3 as a function of frequency with a power output of 14 dBm.

FIG. 6 illustrates the closed loop intermodulation characteristics of the amplifier 10 at 14 dBm power. In FIG. 6, the sidebands 44a, 46a have been substantially reduced over the open loop sidebands 44, 46 of FIG. 5.

It will be understood that the exact arrangement relative to one another of the delay element 14, the filter 16, and the gain element 18 may be varied without departing from the spirit and scope of the present invention. For example, either the delay element 14 or the filter 16 could be coupled in series between coupler 12c and the output port of the gain element 18. Alternate configurations could also come within the spirit and scope of the present invention.

From the foregoing, it will be observed that numerous variations and modifications may be effected without departing from the spirit and scope of the invention. It is to be understood that no limitation with respect to the specific apparatus illustrated herein is intended or should be inferred. It is, of course, intended to cover by the appended claims all such modifications as fall within the scope of the claims.

What is claimed is:

1. An amplifier that is usable in a predetermined frequency band with a center frequency in a range on the order of 700–1000 MHz and that has a relatively low closed loop gain comprising:
    a signal input node;
    an amplified signal output node;
    a gain element with an input port and an output port wherein said element has substantially no delay between said ports in the frequency range;
    a band limiting filter coupled to said gain element; and
    a single, substantially lossless, feedback coupling element connected between said input port and said output port, and connected further to said input node and said output node, wherein an applied input signal of a selected frequency and an amplified output signal having said frequency are out of phase with one another over the predetermined band thereby producing a stable negative feedback condition.

2. An amplifier as in claim 1 wherein said coupling element includes first and second elongated, adjacent coupling conductors with each said conductor having a first end and a second end, wherein said first ends are each coupled to one of said ports and said second ends are each coupled to one of said nodes.

3. An amplifier as in claim 2 including a non-conductive substrate and wherein said coupling conductors are deposited thereon.

4. An amplifier as in claim 1 wherein said coupling element includes a transformerless, passive, four port member with two spaced-apart coupling conductors, wherein one of said passive ports is coupled to said input node, another of said passive ports is coupled to said output node, another of said passive ports is coupled to said amplifier input port, and another of said passive ports is coupled to said amplifier output port, wherein an electrical signal applied to said input node passes through one of said coupling conductors before reaching said amplifier input port.

5. An amplifier as in claim 1 which further includes a phase adjusting element coupled to said gain element.

6. An amplifier as in claim 1 wherein said coupling element has a first conductor coupled to said input port and a second conductor coupled to said output port, wherein said two conductors are electromagnetically coupled and wherein an impedance parameter of said coupling element has a value substantially equal to an impedance parameter of said gain element.

7. An amplifier as in claim 6 wherein said two conductors have a length on the order of a quarter wavelength of the center frequency.

8. An amplifier as in claim 6 wherein said two conductors are spaced apart from one another on the order of 30 mils.

9. A band limited amplifier that is usable at frequencies in excess of 800 MHz with a relatively low closed loop gain comprising:
   a signal input terminal
   an amplified signal output terminal;
   a gain element with an input port and an output port wherein said element has substantially no delay between said ports in the frequency range;
   a single, substantially lossless, transformerless, feedback element, including space-apart, coupled conductors, coupled between said input terminal, and said output terminal, and also coupled between said output terminal and said output port and
   a band pass filter, with a predetermined band width set to a predetermined center frequency, coupled to at least said gain element wherein an input signal with a frequency within the band will be amplified without substantially any frequency shift.

10. An amplifier as in claim 9 wherein said coupled conductors include first and second deposited, elongated, adjacent, coupling conducting members.

11. An amplifier as in claim 9 wherein said coupled conductors are linear, with a length on the order of a quarter wavelength of a selected center frequency.

12. An amplifier as in claim 9 including means, coupled to at least said feedback element for adjusting a phase relationship between a signal applied to said input terminal and an amplified signal at said output terminal.

13. An amplifier with a closed loop gain less than 20 Db usable in a frequency range on the order of 700–1000 MHz to amplify applied electrical signals, without frequency shift within a predetermined band having a selected center frequency comprising:
   an input node to which signals to be amplified can be coupled;
   an output node to which amplified output signals can be coupled;
   a band limiting filter corresponding to the predetermined band with a filter input and a filter output wherein said input node is coupled to said filter input;
   a phase adjusting element with an element input and an element output wherein said filter output is coupled to said element input;
   a gain circuit with an input port and an output port wherein said input port is coupled to said element output;
   a transformerless;, substantially lossless feedback element which includes first and second adjacent, mutually coupled, conductors wherein one of said mutually coupled conductors is coupled between said output port and said output node and said other mutually coupled conductor is coupled between said input node and said input port and wherein the closed loop gain in the predetermined band is less than 20 dB.

14. An amplifier as in claim 13 wherein said mutually coupled conductors have a length on the order of a quarter wavelength of the center frequency.

15. An amplifier as in claim 13 wherein said gain circuit includes an input impedance of a selected value and wherein said feedback element includes an impedance parameter having said selected value at the center frequency.

16. An amplifier as in claim 13 wherein said gain circuit is substantially delayless over the predetermined band.

17. A feedback amplifier with a closed loop gain of less than 20 dB in a predetermined frequency band in a range of 70–1000 MHz comprising:
   an amplifier circuit with an input and an output;
   a substantially lossless, transformerless feedback element coupled between said input and said output;
   a filter for defining the predetermined band coupled to at least said amplifier circuit; and
   a phase adjusting element for producing a negative feedback condition in the band coupled to at least said filter, wherein the amplifier has an overall closed loop gain in a range between 5–15 dB in the predetermined band.

* * * * *

UNITED STATES PATENT AND TRADEMARK OFFICE
CERTIFICATE OF CORRECTION

PATENT NO. : 5,430,412
DATED      : July 4, 1995
INVENTOR(S) : David A. Freer

It is certified that error appears in the above-indentified patent and that said Letters Patent is hereby corrected as shown below:

Column 3, line 36, after "FIG. 2" insert —the conducting members of the feed back element 12 are deposited on a substrate S—.

Column 3, line 65, delete [66.1] and insert —866.1—.

Signed and Sealed this

Fifth Day of December, 1995

*Attest:*

BRUCE LEHMAN

*Attesting Officer*    Commissioner of Patents and Trademarks